US 6,742,088 B1

(12) United States Patent
Wielage et al.

(10) Patent No.: US 6,742,088 B1
(45) Date of Patent: May 25, 2004

(54) DEVICE CONTAINING A MULTI-PORT MEMORY

(75) Inventors: Paul Wielage, Eindhoven (NL); Albert Van Der Werf, Eindhoven (NL); Leonardus Sevat, Eindhoven (NL); Lodewijk Bellefroid, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/400,958

(22) Filed: Sep. 22, 1999

(30) Foreign Application Priority Data

Sep. 25, 1998 (EP) ............................................. 98203219

(51) Int. Cl.[7] ............................................. G06F 12/00
(52) U.S. Cl. .................................... 711/149; 365/230.05
(58) Field of Search ....................... 711/149; 365/230.05

(56) References Cited

U.S. PATENT DOCUMENTS

| | | | | |
|---|---|---|---|---|
| 4,967,398 A | * | 10/1990 | Jamoua et al. ......... | 365/230.05 |
| 5,204,841 A | * | 4/1993 | Chappell et al. ....... | 365/230.05 |
| 5,301,340 A | * | 4/1994 | Cook ......................... | 712/24 |
| 5,341,473 A | * | 8/1994 | Takayama .................. | 709/216 |
| 5,612,923 A | * | 3/1997 | Gibson et al. ......... | 365/230.05 |
| 6,314,499 B1 | * | 11/2001 | Kermani ..................... | 711/147 |

FOREIGN PATENT DOCUMENTS

EP          0471932 A2    2/1992    ............. G11C/7/00

OTHER PUBLICATIONS

Matsumura et al. "Pipelined, Time–Sharing Access Technique for a Highly Integrated Multi–Port Memory", 1990 Symposium on VLSI Circuits IEEE.*
Endo et al. "Pipelined, Time–Sharing Access Technique for a Highly Integrated Multi–Port Memory", Apr. 1991 IEEE Journal of Solid–State Circuits v26 n4.*
Ken–Ichi et al: "Pipeliled, Time–Sharing Access Technique for an Integrated Multiport System", IEEE Journal of Solid–State Circuits, vol. 26, No. 4, pp. 549–554.
T. Sazaki, T. Komiya et al, "Time Division Pseudo–Multi–Port Register File With Wave Pipelining", Journal of the Soc. Of Elect. Information & Comm. D–, vol. J80–D–I, No. 3, pp. 223–226, Mar. 1997, and Transactions of the Institute of Electronics Information and Communication Engineers, vol. J80, No. 3 (1997) pp. 223–226.

* cited by examiner

Primary Examiner—Mano Padmanabhan
Assistant Examiner—Paul Baker
(74) Attorney, Agent, or Firm—Michael J. Ure

(57) ABSTRACT

A data processing device contains a time division multiplexed multiport memory. The timing of memory access is defined in time-slots for access to the memory from respective ports. Timing is generated asynchronously with a handshake in response to a ready signal indicating completion of access during a previous time-slot.

8 Claims, 5 Drawing Sheets

DEVICE CONTAINING A MULTI-PORT MEMORY

BACKGROUND AND SUMMARY OF THE INVENTION

A multiport memory with time-division multiplexed access is known from an article by T. Sazaki, T. Komiya, K. Takano, N. Oba, H. Kobayashi and T. Nakamura, titled "Time Division Pseudo Multi-Port Register File with Wave Pipelining" and published in the Transactions of the Institute of Electronics Information and Communication Engineers, Volume J80 No. 3 (1997) pages 223 to 226. A similar circuit is known from an article titled "Pipelined, Time-showing Access Technique for an integrated Multiport memory", by Ken-Ichi Endo, Tsuneo Matsumura and Junzo Yamada, published in the Journal of Solid State Circuits Vol. 26 No. 4 (Apr. 1991) pages 549–554.

Sazaki et al. describes the architecture of a pseudo multiport memory module. A multiport memory is a module that allows to store and retrieve data to/from a single memory core via separate ports. The ports of a real multiport memory are an integral part of the memory design. Typically, these ports have no inter-timing relations (in fact are independent, except that simultaneously reading and writing to the same address is forbidden).

A pseudo multiport (PMP) memory is different in that the memory function is implemented by a standard single port memory. The ports are simulated by successively accessing this memory in time-slots within a clock cycle. The data, address and control inputs for each of the ports are sampled at the rising edge of the clock input. The clock also triggers the sequence of memory accesses.

The circuit disclosed by Sazaki et al. uses successive periods of a 300 Mhz clock to define time-slots for access to the memory. There are three ports. A 100 Mhz clock is used to define access cycles to the ports. Endo et al. we both polaritus of clockedges to access memory.

In principle, the data from memory is needed only at the end of each 100 Mhz cycle, but it is available before the end of the cycle when results derived from memory access should be latched. The time interval between the time that the data becomes available and the end of the cycle is in particular larger from ports that are given access to the memory in the earlier parts of the 100 Mhz clock cycle. During this time interval the data might be passed through combinatorial logic circuitry. This could be used to speed up the circuit, especially in application specific circuits, where the memory is embedded in an integrated circuit designed for some application and such combinatorial logic can readily be designed into the device.

Amongst others, it is an object of the invention to increase the time interval between the time that the data is available from the memory and the end of the memory access cycle in which all ports are enabled to access the memory.

The device according to the invention and its embodiments are described in the Claims. By using handshaking to generate a time-slots for access to the memory, access to the memory is as faster than when the timeslot is generated as a cycle of a high frequency clock that operates at a frequency of N times the frequency at which the ports are accessed.

More time is left between the completion of access and the end of the clock cycle in which data becomes available from the memory because the time-slot is defined asynchronously. In the time that is left, the data from the memory can be used for combinatorial logic operations and the result of such operations can be stored at the end of the cycle. This speeds up the circuit. The delay produced by the combinatorial logic operations may be a considerable part of the clock cycle. If there are N ports, memory access starts at the beginning of a clock cycle and data is available at a port M time slots after the beginning of the clock cycle, then the delay of the combinatorial circuits may be more than (N−M)/N of the clock cycle. This is because each time slot needs to take up less than 1/N of the clock cycle, and does not need to be 1/N of the clock cycle.

Internally in the memory, the handshaking may be used to generate an internal clock signal that is more than N times faster than the system clock, with N being the number of ports. This internal clock is used in the port shell as a time reference, in the sense of the synchronous design style. Thus, design and test of the memory may proceed as for synchronous circuits, which considerably simplifies design and test.

With the proposed architecture, a memory with more than ten ports can be realized. In practice, the upper bound of the number of ports is given by the ratio of the (system) clock period and the memory cycle time.

Compared to conventional multiport memory, this reduces the required silicon area and power consumption, at the expense of longer read access time for all but the first port. The silicon area is proportional to the number of ports (quadratically proproportional in the prior art). Power consumption hardly depends on the number of ports (linear in the prior art).

An asynchronous controller may be used for the local clock generation. Such a controller is very small: it has a size of approximately 20 gate equivalents. So the internal clock is locally generated without using a PLL. Instead, a ready signal from the memory is used to generate the next clock edge. This approach has three benefits:

it eliminated the PLL, thereby removing a source of IC failures.

it requires less area (approx. 10 times smaller)

it is easier to layout (no additional irregular blocks)

it saves power since the internal clock can be completely disabled when the system clock is gated it gives the shortest access time since the successive memory accesses are maximally compressed.

BRIEF DESCRIPTION OF THE DRAWING

These and other advantageous aspects of the invention will be described with reference to the following Figures.

DETAILED DESCRIPTION

Figure 1:
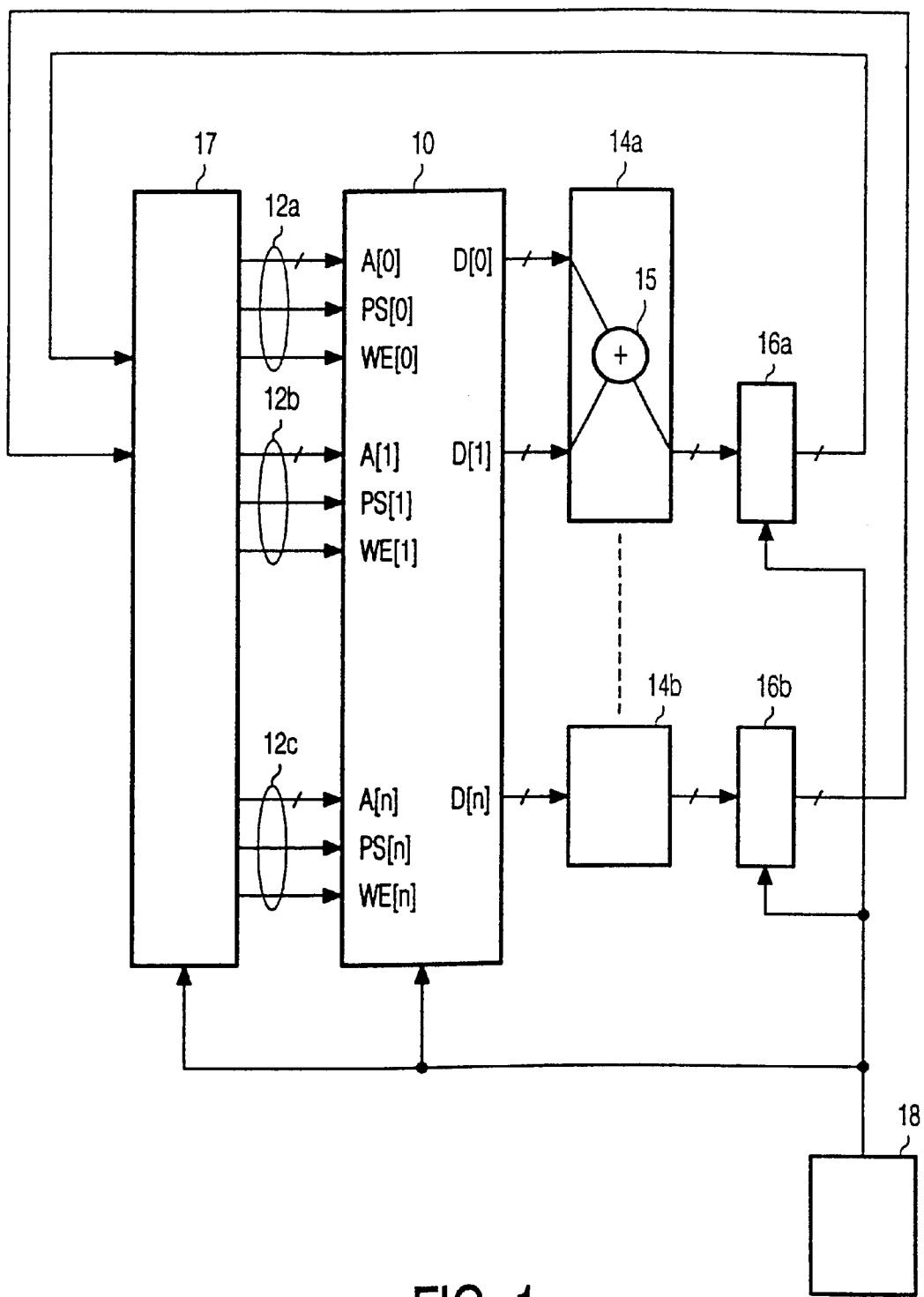
FIG. 1 shows a device with embedded multiport memory

FIG. 1 shows a device with an embedded multi-port memory 10. The device contains logic circuits 17, coupled via a number of ports 12a–c to the multiport memory 10. Output ports of the memory are coupled to combinatorial logic circuits 14a–b. Outputs of combinatorial logic circuits 14a–b are coupled to registers 16a–b, which in turn have outputs coupled to the logic circuit 17. The device comprises a clock circuit 18 coupled to the logic circuits 17, the multi-port memory 10 and the registers 16a–b.

In operation, the device operates under synchronization by a clock signal from clock circuit 18 and it pipelines information. In certain clock cycles the logic circuits 17 produce address signals A, data input signals D, port selection signals PS and write enable/read signals WE for the multi-port memory 10. When the port select signal PS for a certain port is active in a clock cycle, the multi-port memory 10 reads or writes data dependent on the WE signal at an address determined by the address signal A for that port.

In case of a read via a port, data is read from the memory 10 and supplied to the corresponding output D of the memory 10 at that port in the next clock cycle. This data is then processed in the combinatorial circuits 14a–b and a result of processing is latched in the registers 16a–b at the end of this next clock cycle, that is, at the end of the clock cycle in which the multiport memory comes up with the data. The combinatorial logic circuits 14a–b process the data without intermediate storage. By way of example, combinatorial logic circuit 14a is shown to perform an addition 15, but other logic and/or arithmetic operations may be used, either combining data from different ports or using data from one port only.

As will be discussed, data from the multi-port memory becomes available before the end of the clock cycle in which this data is made available from the memory. The time until the end of the clock cycle is used to subject the data to combinatorial logic operations, before storing a result in the registers 16a–b at the end of the clock cycle. In a yet next clock cycle, the data is passed from the registers 16a–b to the logic circuits 17 for further processing. The logic circuits 17 may contain further registers that are clocked by the clock signal.

Depending on the type of the port additional inputs and outputs are associated with the port. There are three types: R (read only), W (write only) and R/W (read or write). A port with read capability has a data output Q. A port with write capability has a data input D. A R/W port has a write-enable input WE to select between reading and writing. Each port of a PMP memory is comparable to the port of a standard single-port memory with a synchronous interface. All inputs are clocked at the rising edge of the clock input CLK. Then, sequentially, all ports are served starting with port 0.

Figure 2:
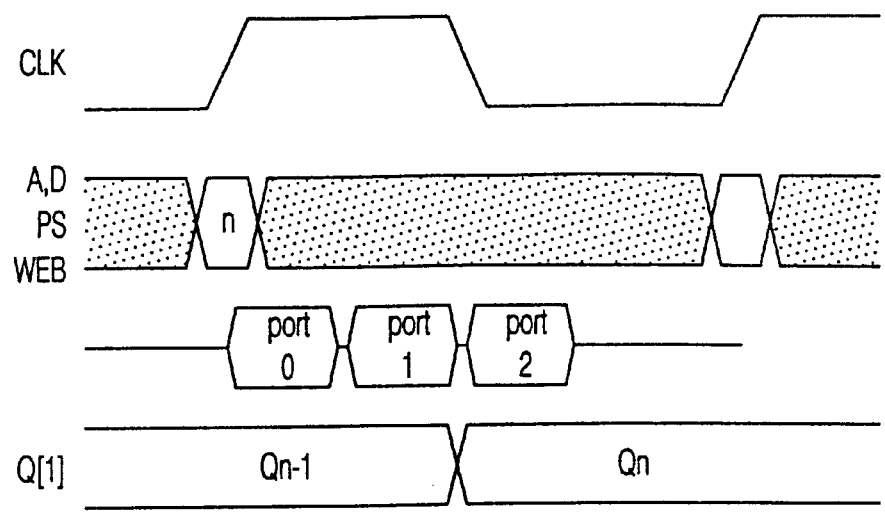
FIG. 2 shows a timing diagram of a multiport memory

FIG. 2 shows a timing diagram of a read access via port 1. Read/write conflicts, which may happen with a real multiport memory when two ports simultaneously access the same address location (one writing and the other reading or writing), will never happen because the ports are served sequentially. Herein all ports will be of the R/W type for the purpose of illustration. The read-only and write-only type of ports are just derivatives of a R/W port.

Figure 3:
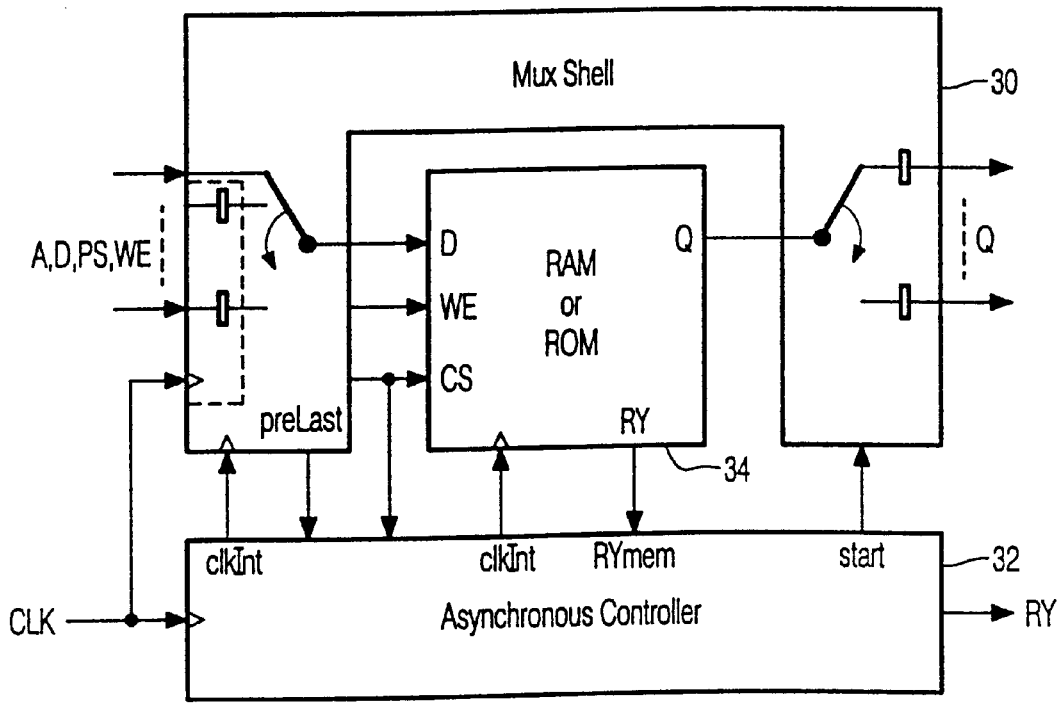
FIG. 3 shows a generic multiport memory module

FIG. 3 shows a block diagram of the generic PMP architecture. It consists of a multiplexer shell 30, an asynchronous controller 32 and a RAM or ROM instance 34.

Figure 4:
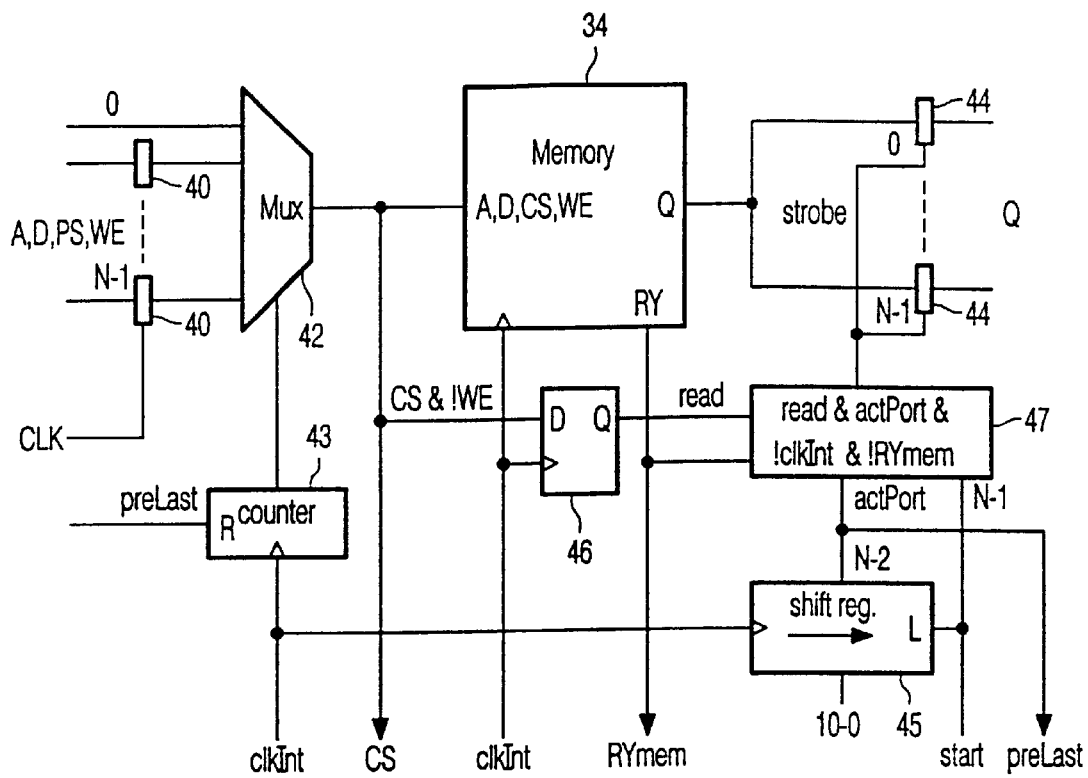
FIG. 4 shows a MUX shell

FIG. 4 shows a block diagram of the multiplexer shell. The multiplexer shell is configuration dependent. It implements the multiport function in standard-cells. On the left hand side in figure the input signals (A, D, PS, WE) of each but the first port are stored in a register 40 at the rising edge of the clock input CLK. The input signals of the first port are not registered. These signals can propagate directly to the memory module. The multiplexer 42 that follows the registers makes a selection out of the A, D, PS, WE (registered) inputs that correspond to one of the ports. The selection is controlled by a counter 43 which holds the active port. All flip-flops in the MUX shell and the memory module are triggered by the local clock signal clkInt.

Figure 5:
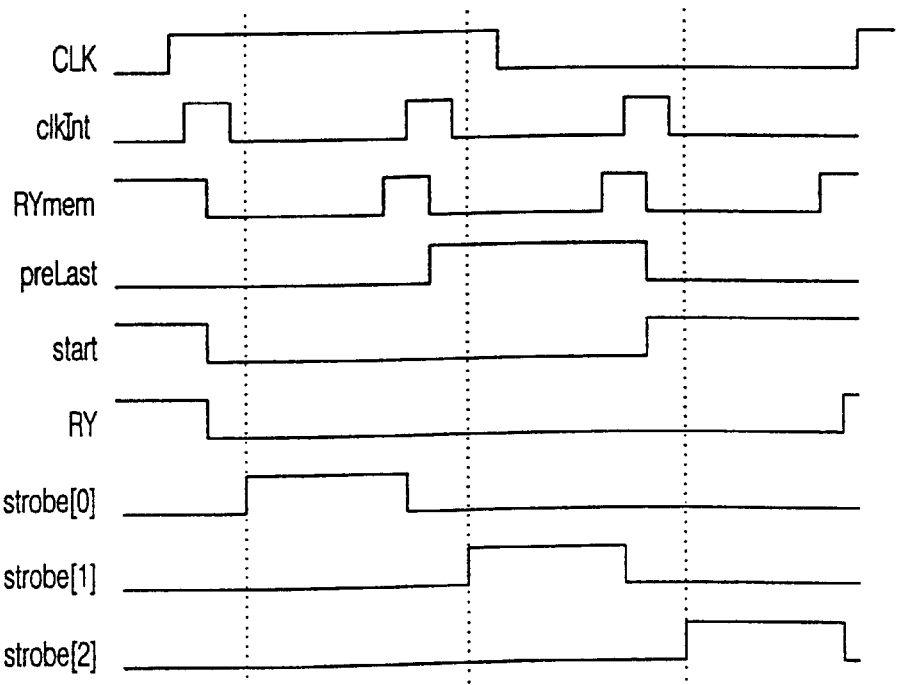
FIG. 5 shows waveforms of signals in a MUX shell

FIG. 5 shows the signal waves inside the mux shell for a three port PMP. The clock period of the internal clock clkInt equals the access time (cycle time) of the memory. This is realized by using the ready output of the memory. It works as follows: (1) a memory access is started by a rising edge of clkInt, (2) the memory gives notices of its busy state by lowering RYmem, (3) the asynchronous controller replies by making clkInt low, (4) after some time, the memory access completion is signaled by a high level of RYmem. This last event restarts the sequence until all ports have been served.

A read access differs from a write access in that the data read from the memory must be copied to the Q register/latches corresponding to the active port. The shortest read access times can be achieved when the data is stored in latches 44. The latches are controlled by the strobe[i] signals (i=0 . . . , one for each port). The strobe signal of the active port is 0-1-0 pulse having a width equal to the read-access time (see FIG. 5). During the strobe the latches [44] are transparent, otherwise the latest value is kept.

The strobe bus is deduced from clkInt, actPort, Rymem and "read" as follows:

Strobe[i]=read & actPort[i] & (NOT clkInt) & (NOT Rymem)

The shift register 45 which drives the actPort bus holds the active port: the bit corresponding to the active port is high, the other bits are low. The signal read indicates that a read access is in progress. The signal "read" is generated with a D flip-flop 46, which copies the logic "AND" of CS and (NOT WE) from the active port on the active edge of clkInt. The signals actPort and read are valid when clkInt is low. The rising edge of RYmem indicates that the data out of the memory is valid; consequently the strobe may become low after this event.

The asynchronous controller is configuration independent. It consists of a number of auxiliary circuits and an asynchronous finite state machine (FSM). The asynchronous controller generates a rising edge on the internal clock for each port service. If the active port requires a memory access, which is being controlled by the corresponding PS input, the rising edge on the internal clock results in a handshake with the memory via the clkInt, RYmem signal pair (clkInt triggers the memory and RYmem indicates the completion of a memory access). If the active port is not selected, a handshake is performed with an auxiliary circuit which produces a dummy ready signals called RYdum.

The controller is triggered by the external clock CLK and continues to generate rising edges on the internal clock until the MUX shell signals, via preLast, that the last port has been completed.

Figure 6:
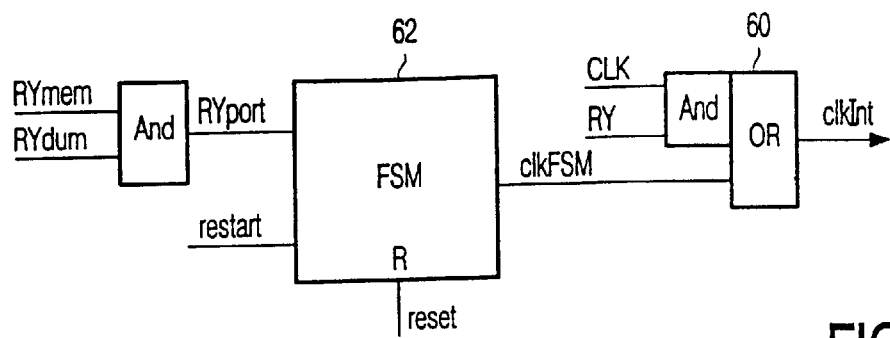
FIG. 6 shows a clock generation circuit

FIG. 6 shows the synthesis of the internal clock clkInt. The AND-OR 60 gate merges the external clock with the clock from the FSM 62. The FSM 62 has a well defined behaviour that can be formally described by a signal transition graph (STG). A STG is an event-based specification for an asynchronous circuit. It is composed of transitions and places. A transition represents a change of values of an input or output signal. A place represents a pre- and post-condition of transitions. It can be marked with a token, meaning that the corresponding condition holds in the circuit. When all pre-conditions of a transition are marked, the transition may fire which means that the tokens are removed from its pre-conditions and added to its post-conditions. Note that a STG specifies not only the behaviour of an asynchronous circuit but also of the environment in which it operates. The causality relations, described by places joining pairs of transitions, represent how the circuit and its environment can react to signal transitions. In a STG places are shown as circles, transitions are shown as boxes and places with exactly one predecessor and one successor (implicit places) are omitted. The label of a transition is composed of the signal name preceded by a "+" or a "−" indicating a rising and falling edge respectively.

Figure 7:
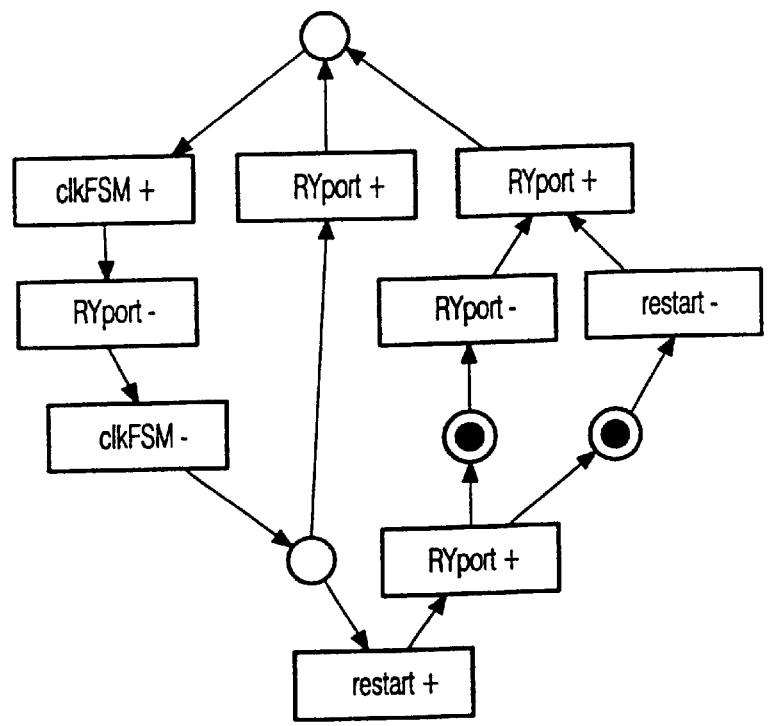
FIG. 7 shows a state diagram of a finite state machine

The STG of the FSM 62 is given in FIG. 7. Signal RYport indicates completion of either a memory handshake or a dummy handshake. Signal restart is the same as the start signal, however a little delayed (it changes when clkInt becomes low).

Figure 8:
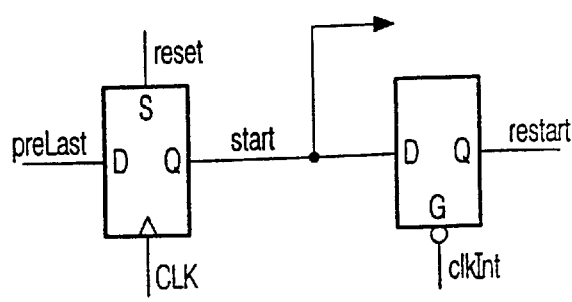
FIG. 8 shows a restart delay circuit

FIG. 8 shows the circuit for generating restart. Given the STG it is possible to synthesize a speed-independent circuit with an equivalent behaviour. For this job we have used the tool PETRIFY which has been developed at the University Politecnica de Catalunya, Barcelona and is described by J. Cortadella, M. Kishinevsky, A. Kondratyev, L. Lavagno and A. Yakovlev", in an article titled "Petrify: a tool for manipulating concurrent specifications and synthesis of asynchronous controllers", published in "IEICE Transactions on Information and Systems", volume="E80-D", number =Mar. 3, 1997, pages 315–325.

Signal RY indicates the global ready state of the PMP module. In FIG. 5 the waveform of RY is given for a three port. This ready signal is used to merge the external clock with the clock from the FSM.

Figure 9:
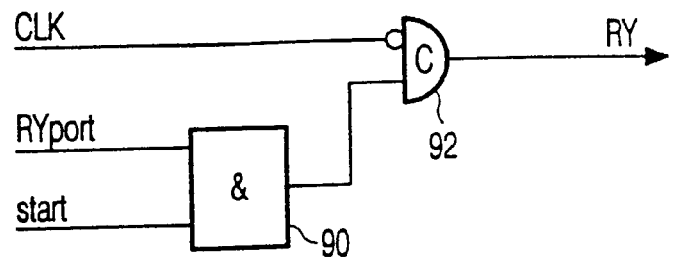
FIG. 9 shows a RY circuit

FIG. 9 gives the ready circuit. The circuit is designed such that the logical AND 90 of RY and CLK yields the first internal clock pulse. Functionally the ready state is the logical AND 90 of RYport and start. However, in order to prevent RY becoming high before CLK has been low, the ready state is combined with the CLK via a Muller-C element 92. (A Muller-C element changes to '1' when both inputs are high and to '0' when both inputs are low.) A simple AND gate would not do the job because this may potentially result in clock pulse that is too small when clkInt is heavily loaded.

Figure 10:
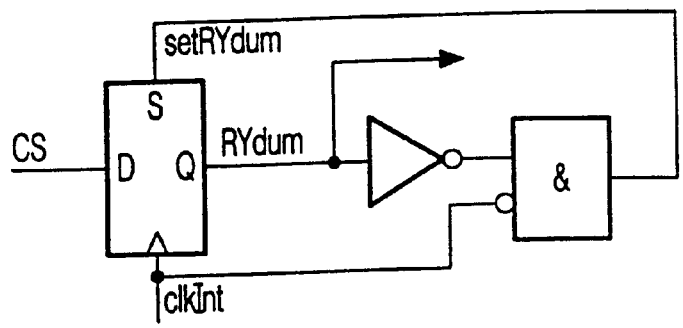
FIG. 10 shows a dummy ready circuit

FIG. 10 shows the circuit which produces the RYdum signal. In fact it is a flip-flop that samples the CS input of the memory at the rising edge of the internal clock. If a zero is sampled, which means that the port does not result in a memory access, RYdum must generate a 1-0-1 pulse, just like RYmem, as explained in section. This is obtain by activating the asynchronous set input of the FF, when the internal clock becomes low.

Figure 11:
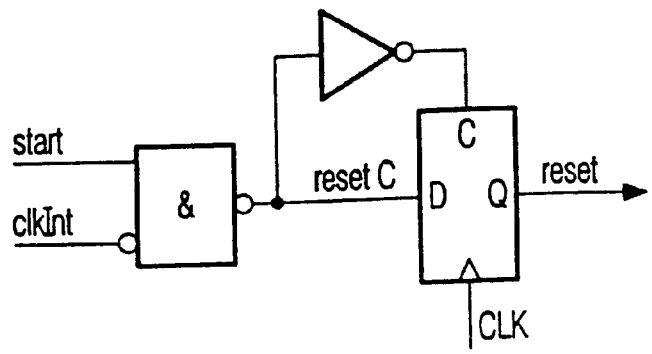
FIG. 11 shows a reset circuit.

In order to reset the state machines from unwanted deadlock states, the reset circuit given in FIG. 11 has been designed. It generates a reset pulse if the state of the PMP at the rising external clock edge is not equal to the final/initial state. This circuit will also become active if the controller has been trapped in a deadlock state due to EMC. The combinatorial delays in the shell 30 should be shorter than the minimum delay from CLKInt via RYport.

What is claimed is:

1. A data processing device comprising
a time division multiplexed multiport memory and
a timing control circuit for defining time-slots for access to the memory from respective ports,
characterized in that
the timing control circuit is coupled to the memory via a handshake interface for starting at least one of the time-slots asynchronously, in response to a ready signal indicating completion of access during a previous time-slot.

2. A data processing device comprising
a time division multiplexed multiport memory;
a timing control circuit for defining time-slots for access to the memory from respective ports, characterized in that
the timing control circuit is coupled to the memory via a handshake interface for starting at least one of the time-slots asynchronously, in response to a ready signal indicating completion of access during a previous time-slot; and
a clock circuit and logic circuits wherein the memory is functionally embedded,
the logic circuits being clocked by a clock signal from the clock circuit,
the clock circuit being coupled to the timing control circuit for starting a cycle of time-slots, the cycle of time slots taking up a part of a period of the clock signal.

3. A data processing device according to claim 2, at least two of the ports receiving control signals from the logic circuits at the same phase of said cycle, the memory starting outputting data on the at least two of the ports to the logic circuits successively, for each one of the at least two of the ports at a respective time triggered by the ready signal indicating completion of access in the time-slot for that one of the at least two ports.

4. A data processing device according to claim 3, comprising combinatorial logic circuits and registers coupled to a data output of the ports via the combinatorial logic circuits, the registers having a clock input coupled to said clock circuit for storing results obtained by combinatorial logic processing of data from the ports, at a completion of a clock cycle in which that data was first made available from the ports.

5. A data processing device comprising
a time division multiplexed multiport memory and
a timing control circuit for defining time-slots for access to the memory from respective ports,
characterized in that
the timing control circuit is coupled to the memory via a handshake interface for starting at least one of the time-slots asynchronously, in response to a ready signal indicating completion of access during a previous time-slot,
the memory having a start access input and an access ready output, for receiving a start signal to start access and for generating a ready signal upon completion of access respectively, and
the timing control circuit is coupled to the start access input and the access ready output for generating the start signal to start access for a time-slot in response to reception of the ready signal upon completion of a preceding time-slot.

6. A data processing device according to claim 5, comprising a dummy ready signal generating circuit, coupled in parallel with the memory, for generating the ready signal in response to the start signal in a time-slot wherein the memory is connected to a port that applies a non-select signal to the memory.

7. A data processing device according to claim 2, comprising two or more ports and a multiplexer for coupling the ports to the memory successively in the cycle of time slots, each port, except a first one of the ports that is coupled to the memory before any of the other ports, being coupled to the multiplexer via a respective register for holding data from a start of the cycle.

8. A data processing device according to claim 1, in which data address and control inputs for all ports are sampled substantially simultaneously at a common edge of an input clock, the ports getting access to the memory successively in a sequence, timed asynchronously from the input clock, except for a start of said sequence.

* * * * *